United States Patent [19]

Kumada et al.

[11] Patent Number: 5,405,445
[45] Date of Patent: Apr. 11, 1995

[54] VACUUM EXTRACTION SYSTEM FOR CHEMICAL VAPOR DEPOSITION REACTOR VESSEL AND TRAPPING DEVICE INCORPORATED THEREIN

[75] Inventors: Masatoshi Kumada; Koichi Nakagawa, both of Kawasaki, Japan

[73] Assignee: Fujitsu Limited, Kawasaki, Japan

[21] Appl. No.: 987,740

[22] Filed: Dec. 10, 1992

[30] Foreign Application Priority Data

Dec. 11, 1991 [JP] Japan .................. 3-327200

[51] Int. Cl.[6] .............................. C23C 16/00
[52] U.S. Cl. ............... 118/719; 118/715; 118/724; 423/210; 423/337; 422/168; 422/173; 422/176; 422/180
[58] Field of Search ......... 118/715, 724, 719; 422/168, 173, 176, 180; 423/210, 337

[56] References Cited

U.S. PATENT DOCUMENTS

| | | | |
|---|---|---|---|
| 2,791,490 | 5/1957 | Willcox | 422/158 |
| 3,069,281 | 12/1962 | Wilson | 422/158 |
| 3,540,853 | 11/1970 | Kulling | 422/158 |
| 3,586,055 | 6/1971 | Wilson | 422/158 |
| 4,250,428 | 2/1981 | Oliver | 313/268 |
| 4,327,057 | 4/1982 | Bruning | 422/182 |
| 4,801,437 | 1/1989 | Konagaya | 423/337 |
| 5,075,090 | 12/1991 | Lewis | 423/337 |
| 5,123,836 | 6/1992 | Yoneda | 423/337 |
| 5,183,646 | 2/1993 | Anderson | 422/182 |

FOREIGN PATENT DOCUMENTS

| | | | |
|---|---|---|---|
| 0285485 | 10/1988 | European Pat. Off. | 423/210 |
| 3703079 | 8/1988 | Germany | 423/337 |
| 58-39373 | 8/1983 | Japan | 423/210 |
| 59-84019 | 5/1984 | Japan | 423/210 |
| 63-62528 | 5/1988 | Japan | 423/210 |
| 1-293120 | 11/1989 | Japan . | |
| 1-312833 | 12/1989 | Japan | 118/715 |
| 2-119920 | 5/1990 | Japan | 423/210 |
| 2243311 | 10/1991 | United Kingdom | 422/168 |

*Primary Examiner*—Richard Bueker
*Attorney, Agent, or Firm*—Armstrong, Westerman, Hattori, McLeland & Naughton

[57] ABSTRACT

A vacuum extraction system is connected to a reactor vessel in which a chemical vapor deposition (CVD) process is carried out by using a suitable starting gas. The system comprises a pump for extracting a vacuum from the vessel, and a trapping device provided in the vessel and the pump for treating a starting gas pulled from the vessel into the system during the CVD process. The treatment of the starting gas pulled from the vessel is performed by using a gaseous oxidizing agent for separating a deposition component from the starting gas pulled from the vessel as an oxide, whereby a build-up of the component of the gas can be prevented in the pump. The trapping device comprises a tank body for receiving the starting gas pulled therein, and a perforated tube for introducing the gaseous oxidizing agent into the tank body to separate the deposition component of the received starting gas therefrom as an oxide.

10 Claims, 2 Drawing Sheets

VACUUM EXTRACTION SYSTEM FOR CHEMICAL VAPOR DEPOSITION REACTOR VESSEL AND TRAPPING DEVICE INCORPORATED THEREIN

BACKGROUND OF THE INVENTION

1. Field of the Invention

The present invention relates to a vacuum extraction system for creating a vacuum in a reactor vessel in which a chemical vapor deposition (CVD) process is carried out to form a thin film on a substrate for production of, for example, a semiconductor, and also relates to a trapping device incorporated in such a vacuum extraction system for treating a starting gas pulled from the reactor vessel thereinto.

2. Description of the Related Art

In a CVD process such as a thermal decomposition CVD process, a photo-assisted CVD process, and a plasma-assisted CVD process, a starting gas is decomposed and activated within a reactor vessel to produce active species as decomposition products, and the active species are deposited on a substrate to form a thin film thereon. For example, when a silane gas ($SiH_4$, $Si_2H_6$) is used as the starting gas, a silicon thin film is formed on the substrate. During the CVD process, the starting gas is continuously introduced into the reactor vessel, but a vacuum is continuously drawn from the reactor vessel through a vacuum extraction system connected to thereto, so that a given low pressure is maintained in the reactor vessel to properly control the growth of the thin film.

As is well known, in the CVD process as mentioned above, the starting gas cannot be completely used in the formation of the thin film, and a large part thereof is pulled from the reactor vessel into the vacuum extraction system, so that a mechanical booster pump, a rotary pump, and other elements included therein may be damaged by the starting gas pulled from the reactor vessel. Namely, a deposition component (e.g., Si) of the starting gas pulled from the reactor vessel is separated therefrom, and a build-up of the separated deposition component occurs in an interior of the vacuum extraction system. Especially, the build-up of the separated deposition component on internal movable parts of the pumps is problematic because of a high expense thereof. For this reason, the pumps of the vacuum extraction system are connected to the reactor vessel through the intermediary of a water-cooled trap for removing the deposition component from the starting gas, whereby the build-up of the deposition component of the starting gas with respect to the internal movable parts of the pumps can be prevented.

Recently, CVD reactor vessels have become larger for the production of semiconductors at low cost, so that an amount of the starting gas used has also increased. This means that a large amount of the starting gas must be treated in the trap of the vacuum extraction system. Nevertheless, the conventional water-cooled trap fails to treat the large amount of the starting gas due to a low throughput capacity thereof. Namely, a part of the starting gas passes through the trap, and reaches the pumps, to thereby cause a premature deterioration of the pumps.

SUMMARY OF THE INVENTION

Accordingly, an object of the present invention is to provide a vacuum extraction system for creating a vacuum in a chemical vapor deposition reactor vessel, which is arranged such that a mechanical pump included in vacuum extraction system cannot be damaged by a starting gas pulled from the reactor vessel thereinto.

Another object of the present invention is to provide a trapping device incorporated in such a vacuum extraction system, which is constructed so as to enable effective treatment of a large amount of a starting gas pulled from the reactor vessel into the vacuum extraction system.

In accordance with one aspect of the present invention, there is provided a vacuum extraction system for a chemical vapor deposition reactor vessel in which a chemical vapor deposition process is carried out by using a suitable starting gas, which comprises a pumping means for extracting a vacuum from the reactor vessel, and a trapping means provided between the reactor vessel and the pumping means for treating a starting gas pulled from the reactor vessel into the vacuum extraction system during the chemical vapor deposition process, wherein the treatment of the starting gas pulled from the reactor vessel is performed by using a gaseous oxidizing agent for separating a deposition component from the starting gas from the reactor vessel as an oxide, whereby a build-up of the deposition component of the starting gas pulled from the reactor vessel can be prevented in the pumping means.

In accordance with another aspect of the present invention, there is provided a trapping device incorporated in a vacuum extraction system for a chemical vapor deposition reactor vessel, in which a chemical vapor deposition process is carried out by using a suitable starting gas, to treat the starting gas pulled from the reactor vessel into the vacuum extraction system during the chemical vapor deposition process, which comprises, a tank body means for receiving the starting gas pulled therein, and an introduction means for introducing a gaseous oxidizing agent into the tank body means to separate a deposition component of the received starting gas therefrom as an oxide.

Preferably, the tank body means includes a pipe member vertically extended through a wall portion of the tank body means and connected to the reactor vessel to receive the starting gas pulled therein, and the introduction means includes a perforated tube member concentrically disposed within the pipe member for introducing the gaseous oxidizing agent into the pipe member through perforations formed in the perforated tube member, whereby the starting gas pulled from the reactor vessel can be effectively mixed with the gaseous oxidizing agent during the passage thereof through the pipe member.

The tank body means may further include a bottom container member disposed below a lower end of the pipe member to receive the separated oxide, and the bottom container member is cooled to build up the separated oxide therein. Preferably, the gaseous oxidizing agent is heated to prevent an adhesion of the separated oxide to an inner wall surface of the pipe member and an outer surface of the perforated tube member. Alternatively, the pipe member has a heater for preventing an adhesion of the separated oxide to an inner wall surface of the pipe member, and the perforated tube member has a heater for preventing an adhesion of the separated oxide to an outer surface of the perforated tube member.

BRIEF DESCRIPTION OF THE DRAWINGS

Other objects and advantages of the present invention will be better understood from the following description, with reference to the accompanying drawings, in which.

DESCRIPTION OF THE PREFERRED EMBODIMENTS

Figure 1:
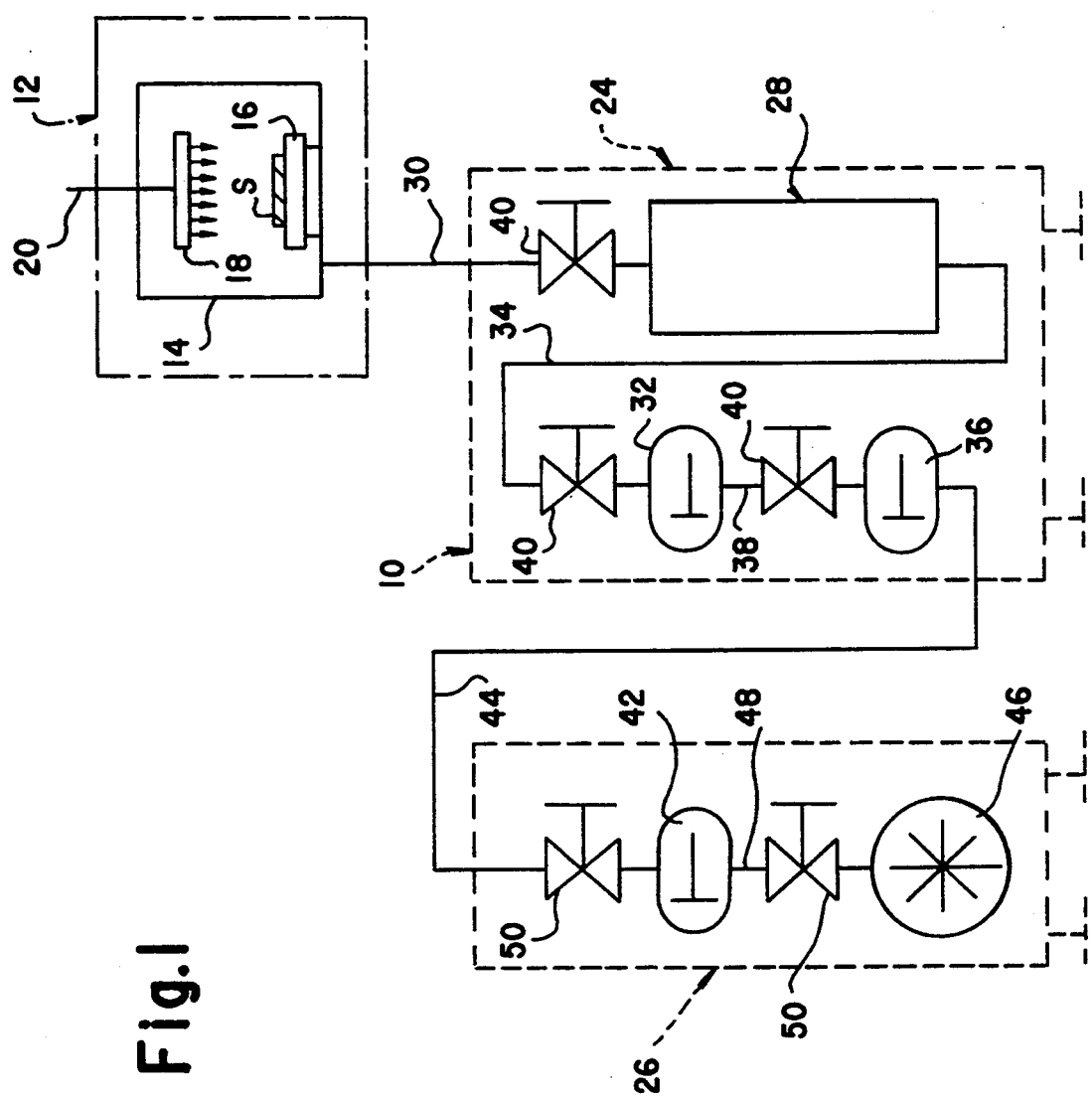
FIG. 1 is a diagrammatic view showing a vacuum extraction system for a chemical vapor deposition reactor vessel according to the present invention.

FIG. 1 diagrammatically shows a vacuum extraction system, generally indicated by reference numeral 10, in which the present invention is embodied, and a chemical vapor deposition (CVD) apparatus, generally indicated by reference numeral 12, which is associated with the vacuum extraction system 10 to extract a vacuum from a reactor vessel 14 of the CVD apparatus 12.

In the example shown in FIG. 1, the CVD apparatus 12 is arranged such that a plasma-assisted CVD process is carried out in the reactor vessel 14. Namely, the reactor vessel 14 includes a first electrode 16 and a second electrode 18 provided therewithin, and these electrodes 16 and 18 are disposed to define an electric discharge zone therebetween. The first electrode 16 is fixed on a bottom of the reactor vessel 14, and is electrically grounded. A substrate S is mounted on the first electrode 16, and may be heated by a suitable electric heater incorporated therein. The second electrode 18 is suspended from a top of the reactor vessel 14 by a suitable support member (not shown), and has a hollow space (not shown) formed therein, into which a starting gas such as a silane gas ($SiH_4$, $Si_2H_6$), a titanium tetrachloride gas ($TiCl_4$) or the like is successively introduced from a starting gas source (not shown) through a conduit 20. When a radio frequency (RF) voltage is applied between the first and second electrodes 16 and 18 to cause a RF discharge therebetween, the electrons generated by the RF discharge collide with the starting gas molecules so that a plasma is developed in the discharge zone between the first and second electrodes 16 and 18. Namely, the starting gas is decomposed and activated within the reactor vessel 14 to produce active species as decomposition products, and thus the active species are deposited on the substrate S to form a thin film thereon.

During the CVD process, the vacuum is continuously drawn or extracted from the reactor vessel 14 through the vacuum extraction system 10, so that a given low pressure is maintained in the reactor vessel 14 to properly control the growth of the thin film. In this embodiment, the vacuum extraction system 10 comprises a first tower 24 and a second tower 24 disposed side by side, as shown in FIG. 1. The first tower 24 includes a trapping device 28 connected to the reactor vessel 14 through a conduit 30 extended therebetween, a first mechanical booster 32 pump connected to the trapping device 28 through a conduit 34 extended therebetween, a second mechanical booster pump 36 connected to the first booster pump 32 through a conduit 36 extended therebetween, and three cylinder valves 40 provided in the conduits 30, 34 and 38, respectively. The second tower 26 includes a third mechanical booster pump 42 connected to the second mechanical booster pump through a conduit 44 extended therebetween, a water ring vacuum pump 46 connected to the third mechanical booster pump 42 through a conduit 48 extended therebetween, and two cylinder valves 50 provided in the conduits 44 and 48, respectively.

Figure 2:
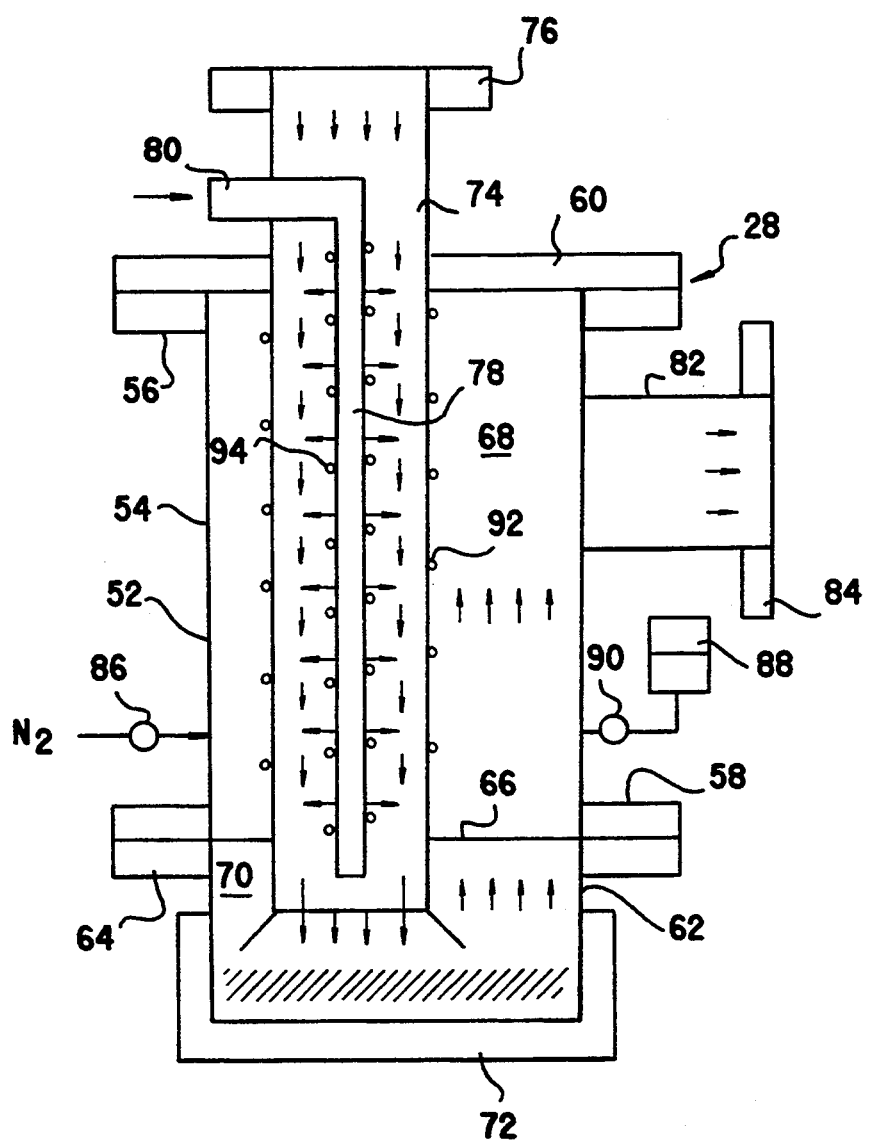
FIG. 2 is a diagrammatic view showing a trapping device incorporated in the vacuum extraction system shown in FIG. 1.

Although the trapping device 28 according to the present invention is only shown as a block in FIG. 1, this device is arranged as shown in detail in FIG. 2. In particular, the trapping device 28 comprises a cylindrical tank body 52 including a cylindrical barrel member 54 having two flanges 56 and 58 formed at upper and lower open ends thereof, respectively, a top wall member 60 securely fixed to the upper flange 56 by bolts, and a bottom container member 62 having a flange 64 formed at an upper open end thereof and securely connected to the lower end of the barrel member 54 by fixing the flanges 58 and 64 to each other by bolts. When the bottom container member 62 is securely connected to the lower end of the barrel member 54, a perforated plate member 66 is intervened therebetween so as to divide an interior of the tank body 52 into an upper chamber 68 and a lower chamber 70. The bottom container member 62 is covered by a water jacket 72, and is cooled by a cooling water circulated therethrough.

The tank body 52 also includes a pipe member 74 incorporated therein and supported by the top wall member 60 and the perforated plate member 66 such that an upper end of the pipe member 74 is extended through the top wall member 60 and a lower end thereof is extended through the perforated plate member 66 to be opened to the lower chamber 70. The upper or outer end of the pipe member 74 forms an inlet port of the trapping device 28, and is connected to the conduit 30 (FIG. 1) by a flange 76 formed thereat. The tank body 52 further includes a perforated tube member 78 concentrically disposed within the pipe member 74, and this perforated tube member 78 is integrally connected to and supported by a radial tube section 80 which is extended through a side wall portion of the pipe member 74 projected outward from the top wall member 60. The radial tube section 80 is connected to a source for gaseous oxidizing agent (not shown), and a gaseous oxidizing agent such as $O_2$, $H_2O$ or the like is fed from the source to the perforated tube member 78.

The cylindrical barrel member 54 of the tank body 52 is provided with a radial pipe section 82 projected from a side wall thereof and connected to the conduit 34 (FIG. 1) by a flange 84 formed at an outer open end thereof. As shown in FIG. 2, an inert gas such as $N_2$ may be introduced into the interior of the cylindrical barrel member 54 through an adjustable valve 86 for regulating or controlling a pressure of the barrel member 54, and therefore, and a pressure of the reactor vessel 14, if necessary. For this pressure regulation, a pressure gage 88 is in communication with the interior of the barrel member 54 through a valve 90 for detecting the pressure of thereof. The valve 90 is usually closed, and is opened only when the pressure of the barrel member 54 is detected.

As discussed hereinbefore, during the CVD process as mentioned above, a large part of the starting gas is pulled from the reactor vessel 14 into the vacuum extraction system 10 without being consumed for the formation of the thin film, and the starting gas pulled from the reactor vessel is first introduced into the pipe member 74 of the trapping device 28 through the conduit 30, as indicated by a plurality of vertical small arrows in FIG. 2. On the other hand, the gaseous oxidizing agent such as $O_2$, $H_2O$ or the like is discharged from the perforated tube member 78 into the interior of the pipe member 74 through the perforations of the tube member 78, as indicated by a plurality of horizontal small arrows in FIG. 2. Accordingly, a deposition component (e.g. Si; Ti) of the starting gas is separated therefrom as oxide (e.g. SiO, $SiO_2$, $SiO_4$; $TiO_2$), and the separated oxide is received by and built up in the bottom container member 62 cooled by the water jacket 72. It is possible to treat a large amount of the starting gas by feeding a sufficient amount of the gaseous oxidizing agent into the interior of the pipe member 74, i.e., a complete separation of the deposition component from the starting gas can be substantially carried out, and thus the booster pumps 32, 36 and 42, and the water ring vacuum pump 46 cannot be damaged by a build-up of the deposition component of the starting gas. The treated gas is flowed from the lower chamber 70 into the upper chamber 68 through the perforations of the perforated plate member 66, and is then extracted from the trapping device 28 though the radial pipe section 82 thereof by the pumps 32, 36 and 42, and the water ring vacuum pump 46.

Note, in the embodiment as shown in FIG. 2, the concentric arrangement of the pipe member 74 and the perforated tube member 78 is significant in that the starting gas flowing through the pipe member 74 can be effectively mixed with the gaseous oxidizing agent discharged from the perforated tube member 78, whereby the separation of the deposition component from the starting gas can be facilitated.

Preferably, the gaseous oxidizing agent is heated to prevent an adhesion of the separated oxide to an inner wall surface of the pipe member 74 and an outer surface of the perforated tube member 78. Alternatively, the pipe member 74 and the perforated tube member 78 may heated by electrical heater wires 92 and 94 spirally wound therearound, respectively.

Finally, it will be understood by those skilled in the art that the foregoing description is of preferred embodiments of the present invention, and that various changes and modifications can be made without departing from the spirit and scope thereof.

We claim:

1. An apparatus comprising a chemical vapor deposition reactor vessel in which a chemical vapor deposition process is carried out by using a suitable starting gas, and a vacuum extraction system, the vacuum extraction system comprising:
    a pumping means for drawing a vacuum in said reactor vessel;
    a trapping means provided between said reactor vessel and said pumping means for treating a starting gas pulled from said reactor vessel into the vacuum extraction system during the chemical vapor deposition process in the reactor vessel, and
    an introduction means for directly and additionally introducing a gaseous oxidizing agent into said trapping means,
    wherein the treatment of the starting gas pulled from said reactor vessel is performed in the trapping means by using a gaseous oxidizing agent for to separate a deposition component of the starting gas by forming an oxide of the deposition component, whereby a build-up of the deposition component can be prevented in said pumping means.

2. An apparatus as set forth in claim 1, wherein said introduction means introduces a heated gaseous oxidizing agent into said trapping means.

3. An apparatus as set forth in claim 1, wherein said gaseous oxidizing agent comprises an oxygen gas.

4. An apparatus as set forth in claim 1, wherein said gaseous oxidizing agent comprises a gaseous water.

5. A trapping device incorporated in a vacuum extraction system for a chemical vapor deposition reactor vessel, in which a chemical vapor deposition process is carried out by using a suitable starting gas, to treat the starting gas pulled from said reactor vessel into the vacuum extraction system during the chemical vapor deposition process, which comprises:
    a tank body means for receiving the starting gas pulled therein; and
    an introduction means for directly and additionally introducing a gaseous oxidizing agent into said tank body means to form an oxide of a deposition component contained in the received starting gas and thereby separate the deposition component from the received starting gas.

6. A trapping device as set forth in claim 5, wherein said tank body means includes a pipe member vertically extended through a wall portion of said tank body means and connected to said reactor vessel to receive the starting gas pulled therein, and said introduction means includes a perforated tube member concentrically disposed within said pipe member for introducing the gaseous oxidizing agent into said pipe member through perforations formed in said perforated tube member, whereby the starting gas pulled from said reactor vessel can be effectively mixed with the gaseous oxidizing agent during the passage thereof through said pipe member.

7. A trapping device as set forth in claim 6, wherein said tank body means further includes a bottom container member disposed below a lower end of said pipe member to receive the oxide, and said bottom container member is cooled to build up the oxide therein.

8. A trapping device as set forth in claim 7, wherein the gaseous oxidizing agent is heated to prevent adhesion of the oxide to an inner wall surface of said pipe member and an outer surface of said perforated tube member.

9. A trapping device as set forth in claim 7, wherein said pipe member has a heater for preventing adhesion of the oxide to an inner wall surface of said pipe member.

10. A trapping device as set forth in claim 7, wherein said perforated tube member has a heater for preventing adhesion of the oxide to an outer surface of said perforated tube member.

* * * * *